(12) United States Patent
Pontin et al.

(10) Patent No.: US 8,395,464 B2
(45) Date of Patent: Mar. 12, 2013

(54) ACTUATOR/WEDGE IMPROVEMENTS TO EMBEDDED METER SWITCH

(75) Inventors: Joseph Pontin, Seneca, SC (US); David N. Makinson, Seneca, SC (US); Larry O'Dell, Clemson, SC (US)

(73) Assignee: Itron, Inc., Liberty Lake, WA (US)

( * ) Notice: Subject to any disclaimer, the term of this patent is extended or adjusted under 35 U.S.C. 154(b) by 708 days.

(21) Appl. No.: 12/473,692

(22) Filed: May 28, 2009

(65) Prior Publication Data

US 2009/0295371 A1 Dec. 3, 2009

Related U.S. Application Data

(60) Provisional application No. 61/057,632, filed on May 30, 2008, provisional application No. 61/057,623, filed on May 30, 2008.

(51) Int. Cl.
*H01H 67/02* (2006.01)

(52) U.S. Cl. ........... 335/121; 335/78; 335/128; 200/239

(58) Field of Classification Search .............. 335/78–86, 335/121–132; 200/329, 239
See application file for complete search history.

(56) References Cited

U.S. PATENT DOCUMENTS

| 1,139,956 A | 5/1915 | Craft |
| 1,958,159 A | 5/1934 | Bresson |
| 2,021,041 A | 11/1935 | Altamura |
| 2,558,188 A | 6/1951 | McWilliams |
| 2,699,177 A | 10/1955 | Wingfield |
| 2,903,540 A | 9/1959 | Gloviak et al. |
| 2,931,876 A | 4/1960 | Weinfurt |
| 3,346,710 A | 10/1967 | Weston et al. |
| 3,378,663 A | 4/1968 | Abramowitz |
| 3,381,105 A | 4/1968 | Mortenson |
| 3,632,935 A | 1/1972 | Stegmaier |
| 3,689,856 A | 9/1972 | Lambert et al. |
| 3,751,618 A | 8/1973 | Hallerberg |
| 3,842,228 A | 10/1974 | Green |
| 3,902,032 A | 8/1975 | Koepke |
| 4,006,323 A | 2/1977 | Nelson et al. |
| 4,087,669 A | 5/1978 | Sauer |
| 4,178,572 A | 12/1979 | Gaskill et al. |
| 4,230,388 A | 10/1980 | Thierry et al. |
| 4,240,030 A | 12/1980 | Bateman et al. |
| 4,309,581 A | 1/1982 | Macaire et al. |

(Continued)

FOREIGN PATENT DOCUMENTS

| CH | 281257 | 2/1952 |
| DE | 619902 | 10/1935 |

(Continued)

OTHER PUBLICATIONS

PCT International Search Report for PCT International Application No. PCT/US2009/045555 mailed Jul. 20, 2009.

(Continued)

*Primary Examiner* — Bernard Rojas
(74) *Attorney, Agent, or Firm* — Dority & Manning, P.A.

(57) ABSTRACT

Disclosed is a wedge shaped actuator device configured to provide separation of spring supported electrical contacts in an electrical switch. The wedge is configured with dual contour sides to maximize transfer of energy from a drive solenoid to the contact carrying springs. Portions of the wedge are relieved to allow for uninhibited movement of the wedge over side surfaces of the contact carrying springs to avoid digging in of any rough materials from the side edges of the spring as may be occasioned due to stamping techniques used to form the springs.

15 Claims, 2 Drawing Sheets

U.S. PATENT DOCUMENTS

| | | | |
|---|---|---|---|
| 4,321,436 A | | 3/1982 | McGarrity |
| 4,357,509 A | * | 11/1982 | Adlerteg ................... 200/240 |
| 4,412,116 A | | 10/1983 | Golub |
| 4,490,593 A | | 12/1984 | Cook |
| 4,550,232 A | | 10/1985 | Lemmer |
| 4,562,323 A | | 12/1985 | Belbel et al. |
| 4,597,619 A | | 7/1986 | Reimer |
| 4,621,303 A | | 11/1986 | Rowe |
| 4,801,772 A | | 1/1989 | Bratkowski et al. |
| 4,866,633 A | | 9/1989 | Nakane et al. |
| 5,021,760 A | | 6/1991 | Krubsack et al. |
| 5,045,969 A | | 9/1991 | Menasco |
| 5,227,750 A | * | 7/1993 | Connell et al. ................. 335/86 |
| 5,296,660 A | | 3/1994 | Morel et al. |
| 5,296,662 A | | 3/1994 | Engdahl et al. |
| 5,546,269 A | | 8/1996 | Robinson et al. |
| 5,572,396 A | | 11/1996 | Robinson |
| 5,575,309 A | | 11/1996 | Connell |
| 5,583,471 A | | 12/1996 | Weiser et al. |
| 5,586,913 A | | 12/1996 | Robinson et al. |
| 5,608,598 A | | 3/1997 | Dieppedalle et al. |
| 5,668,538 A | | 9/1997 | Warwick |
| 5,694,099 A | * | 12/1997 | Connell et al. ................. 335/78 |
| 5,748,104 A | | 5/1998 | Argyroudis et al. |
| 5,821,481 A | * | 10/1998 | Neubauer ................... 200/4 |
| 5,853,305 A | | 12/1998 | Bedrossian et al. |
| 5,886,860 A | | 3/1999 | Chen et al. |
| 5,952,739 A | | 9/1999 | Grass et al. |
| 6,000,931 A | | 12/1999 | Tanabe et al. |
| 6,034,585 A | | 3/2000 | Donhauser |
| 6,046,660 A | | 4/2000 | Gruner |
| 6,046,661 A | | 4/2000 | Reger et al. |
| 6,056,008 A | | 5/2000 | Adams et al. |
| 6,080,949 A | | 6/2000 | Weber et al. |
| 6,104,586 A | | 8/2000 | Robinson |
| 6,246,306 B1 | | 6/2001 | Gruner |
| 6,252,478 B1 | | 6/2001 | Gruner |
| 6,292,075 B1 | | 9/2001 | Connell et al. |
| 6,320,485 B1 | | 11/2001 | Gruner |
| 6,437,692 B1 | | 8/2002 | Petite et al. |
| 6,441,332 B1 | | 8/2002 | Crawford et al. |
| 6,470,903 B2 | | 10/2002 | Reyman |
| 6,513,545 B2 | | 2/2003 | Rhone et al. |
| 6,520,798 B1 | | 2/2003 | Robinson et al. |
| 6,563,409 B2 | | 5/2003 | Gruner |
| 6,661,319 B2 | * | 12/2003 | Schmelz ................... 335/78 |
| 6,788,176 B2 | | 9/2004 | Schmelz |
| 6,892,751 B2 | | 5/2005 | Sanders |
| 6,906,637 B2 | | 6/2005 | Martin |
| 6,994,309 B2 | | 2/2006 | Fernandez-Sein |
| 7,049,932 B2 | | 5/2006 | French et al. |
| 7,064,671 B2 | | 6/2006 | Vanderah et al. |
| 7,069,161 B2 | | 6/2006 | Gristina et al. |
| 7,088,239 B2 | | 8/2006 | Basinger et al. |
| 7,116,243 B2 | | 10/2006 | Schleich et al. |
| 7,130,722 B2 | | 10/2006 | Soni |
| 7,262,709 B2 | | 8/2007 | Borleske et al. |
| 7,265,652 B2 | | 9/2007 | Ying |
| 7,271,987 B1 | | 9/2007 | Zhang et al. |
| 7,298,288 B2 | | 11/2007 | Nagy et al. |
| 7,362,232 B2 | | 4/2008 | Holle et al. |
| 7,458,387 B2 | | 12/2008 | McGill |
| 7,458,846 B2 | * | 12/2008 | Loehr et al. ................... 439/517 |
| 7,833,034 B2 | * | 11/2010 | Connell ................... 439/251 |
| 8,054,199 B2 | | 11/2011 | Addy |
| 2001/0010032 A1 | | 7/2001 | Ehlers et al. |
| 2002/0030604 A1 | | 3/2002 | Chance et al. |
| 2002/0050885 A1 | | 5/2002 | Gruner |
| 2005/0162149 A1 | | 7/2005 | Makinson et al. |
| 2005/0174256 A1 | | 8/2005 | Berg |
| 2006/0031180 A1 | | 2/2006 | Tamarkin et al. |
| 2006/0066425 A1 | | 3/2006 | Gruner |
| 2006/0278269 A1 | | 12/2006 | McGill |
| 2007/0211768 A1 | | 9/2007 | Cornwall et al. |
| 2008/0177678 A1 | | 7/2008 | Di Martini et al. |
| 2008/0219210 A1 | | 9/2008 | Shuey et al. |
| 2008/0290986 A1 | | 11/2008 | Laughlin-Parker et al. |
| 2011/0000310 A1 | | 1/2011 | Yokohata et al. |
| 2011/0074601 A1 | | 3/2011 | Cornwall |

FOREIGN PATENT DOCUMENTS

| | | |
|---|---|---|
| DE | 1753688 | 10/1957 |
| EP | 0532586 | 4/1996 |
| EP | 0714549 | 5/1998 |
| EP | 0643813 | 6/1998 |
| GB | 1384294 | 2/1975 |
| WO | WO 91/19314 | 12/1991 |
| WO | WO 94/23230 | 10/1994 |
| WO | WO 95/05671 | 2/1995 |
| WO | WO/98/40898 | 9/1998 |
| WO | WO 03/046936 | 6/2003 |
| WO | WO 03/049129 | 6/2003 |
| WO | WO 2005/106907 | 11/2005 |
| WO | WO 2006/024855 | 3/2006 |
| WO | WO 2006/035235 | 4/2006 |
| WO | WO 2009/110192 | 9/2009 |

OTHER PUBLICATIONS

Machine translation of DE 619902 listed above.
Machine translation of CH 281257 listed above.
International Search Report for PCT International Application No. PCT/US2009/045554 mailed Jul. 29, 2009.
David J. Southern P.E., Product Development Manager, FreeWave Technologies, Inc., "Operators Extend SCADA Investment to Vital Cathodic Protection", pp. 16-17 of *Remote Site & Equipment Management Magazine*, Jun./Jul. 2008.
PCT International Search Report for PCT International Application No. PCT/US2010/050383 dated Nov. 18, 2010.
PCT Written Opinion of the International Searching Authority for PCT International Application No. PCT/US12010/050383 dated Nov. 18, 2010.

* cited by examiner

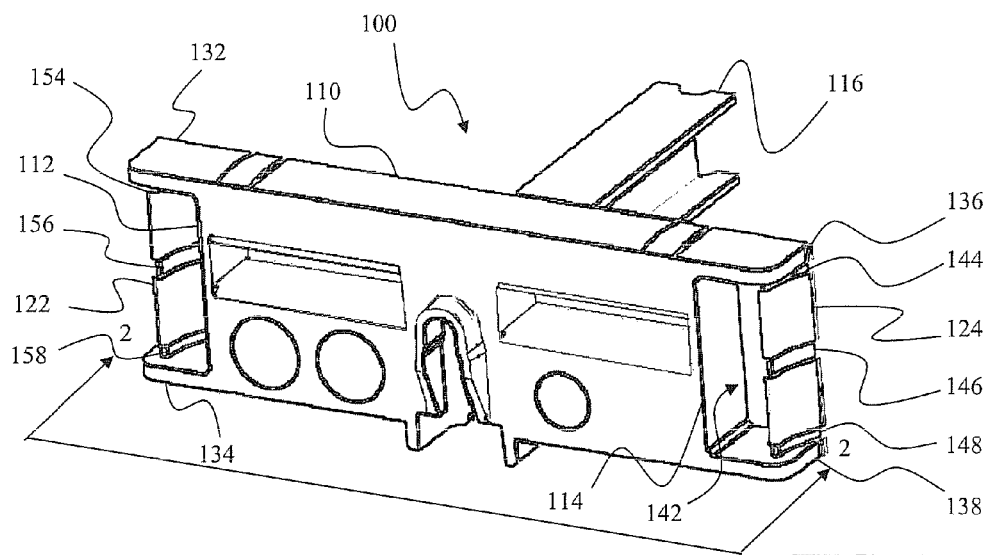
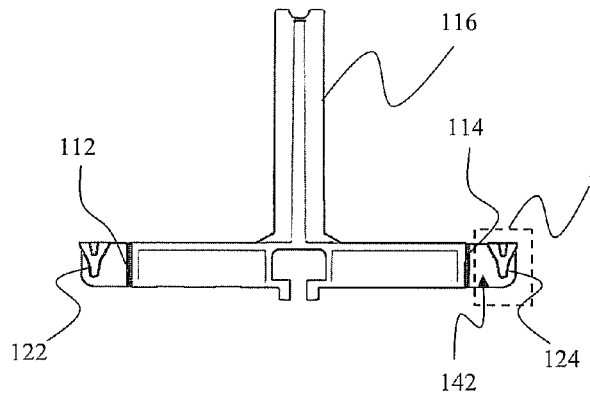
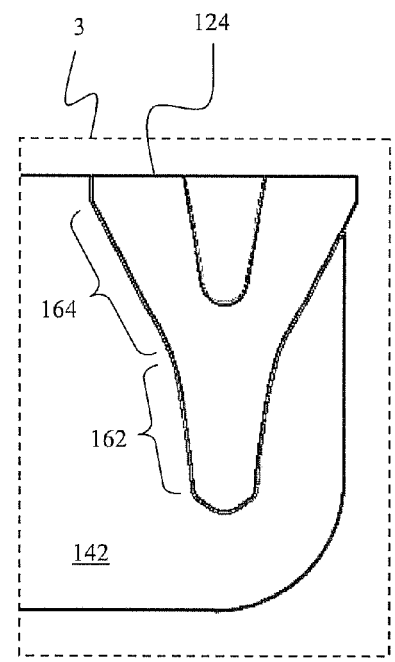

ACTUATOR/WEDGE IMPROVEMENTS TO EMBEDDED METER SWITCH

PRIORITY CLAIMS

This application claims the benefit of previously filed U.S. Provisional Patent Application entitled "Compact Meter With Integrated High Current Switch," assigned U.S. Ser. No. 61/057,623, filed May 30, 2008, and claims the benefit of previously filed U.S. Provisional Patent Application entitled "Actuator/Wedge Improvements To Embedded Meter Switch," assigned U.S. Ser. No. 61/057,632, filed May 30, 2008, both of which are incorporated herein by reference for all purposes.

FIELD OF THE INVENTION

The present subject matter relates to switches. More specifically, the present subject matter relates to operating mechanisms that may be employed with spring type, contact carrying switches especially as may be employed to switch high current.

BACKGROUND OF THE INVENTION

Various metrology devices have been made available over the years incorporating many useful features. Many recent advances have included various forms of automated meter reading (AMR) meters and associated networks that provide metrology devices capable of tracking, storing, and reporting data on many aspects of meter operation and power consumption or generation.

In several of the presently provided devices, a single residential electricity meter may also be configured to collect and transmit data relevant to other utility usage in a residential environment, including natural gas and water usage in addition to electrical usage. Such electricity meters are sometimes also referred to as revenue meters, watt-hour meters, and/or utility meters.

More recently there has been identified a desire to more conveniently control service connections at a residential location. In many instances, for example, when electrical or other utility service is initially provided at a residence, such provision required a technician to visit the location to physically install the meter. Likewise, discontinuation of the service required yet another visit to the location to remove the meter. In certain instances, such as apartment locations, such required site-location visits could involve many man-hours over the course of a year.

To address these time consuming efforts, metrology devices have developed to the point where switches have been associated with the meter either as external separate entities or as self contained devices positioned within the meter housing. In spite of these improvements, however, there remains a desire to more fully integrate the measurement function and circuit interruption functions, both of which are required to respond to residential as well as business energy supply issues. Further, there is a desire to provide switch actuation devices that require minimal operating energy and are highly reliable.

U.S. Pat. No. 7,362,232 (Holle et al.) discloses an arrangement for use in an electrical utility meter that includes a metering unit, a service disconnect circuit, and a housing assembly. The service disconnect circuit includes a self-contained switch mounted within the base portion of the metering unit. Another example of a service disconnect circuit can be found in U.S. Pat. No. 7,130,722 (Soni), which concerns an adapter apparatus containing a disconnect switch. The adapter device is configured for placement between the meter and the meter socket so that neither the meter nor the socket has to be modified to accommodate the adapter.

U.S. Pat. Nos. 6,906,637 (Martin), 6,104,586 (Robinson), 5,952,739 (Grass et al.), and 4,240,030 (Bateman et al.) and US Patent Application Publication US 2005/0174256 (Berg) all disclose variations on co-located switches within meter housing or adapter type devices designed for placement between an existing meter and a meter socket.

U.S. Pat. Nos. 7,265,652 (Ying), 6,441,332 (Crawford et al.), 5,821,481 (Neubauer), 6,080,949 (Weber et al.), 4,621,303 (Rowe), 4,562,323 (Belbel et al.) 4,550,232 (Lemmer), and 3,842,228 (Green) all disclose various insulative devices used to mechanically separate switch contacts.

While various implementations of metrology devices have been developed, and while various combinations of metrology devices and service controlling switch mechanisms have been proposed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved switch operating wedge device and methodology has been provided that may be directly integrated with a high current switching circuit within a utility meter. It should be appreciated by those of ordinary skill in the art, however, that while the present subject matter is described herein as configured for operation of a switch within a meter environment, such is not a specific limitation of the subject matter as the wedge device described herein is usable with a variety of switch structures and in many different environments.

The high current circuit described herein as an exemplary environment in which the wedge, in accordance with present disclosure, may be employed, is a low material usage system comprised of components that integrally function as the current carrying conductors and the circuit interruption mechanics for an electricity meter. The high current switching device is configured to provide physical support for a flux-concentrating core so that when incorporated in a meter base, the flux-concentrating core is positioned to focus a flux field onto a Hall cell mounted on the metrology printed circuit board (PCB).

In an exemplary configuration, the high current circuit elements correspond to a line side terminal assembly and a load side terminal assembly. The line side and load side terminal assemblies respectively may be electrically connected or separated by one or more contact pairs. In an exemplary configuration, four contact pairs may be provided with one contact of each of the four pairs positioned on a contact supporting bar coupled to the line side terminal assembly, and the other contact of each of the four pairs of contacts positioned on one end of one of four spring members. The other end of each of the four spring members is attached to the load side terminal.

In one exemplary configuration, the spring members supporting contacts on one end thereof are provided in pairs such that current flowing from the line side terminal to the load side terminal is respectively divided into two sets of two parallel paths on each side of the contact supporting member. The switch formed by the plurality of contact pairs may be opened by forcing an insulative wedge, in accordance with present disclosure, between portions of the spring pairs to thereby separate the corresponding contacts, thereby interrupting any current flow though the high current circuit elements. Wedge devices constructed in accordance with the present disclosure may be provided singularly, or in pairs or in multiples in order to enable opening of plural power lines simultaneously. As such, the wedges may be incorporated as a single actuator device and operated by a single operating device, for example a solenoid device, to simultaneously open both lines in a residential installation or plural phases (for example, the "A" and "C" phases) of a three phase installation.

Another positive aspect of the presently disclosed wedge device is that the wedges themselves are contoured to maximize energy transfer from a magnetically latching solenoid to the springs. Such improvement results in a reduction on the requirements of total energy that must be provided from a solenoid driver circuit in order to accomplish a full solenoid stroke. Such contouring of the wedge contact separating surfaces results in reductions of requirements on capacitance, voltage, and series resistance, all of which relate to cost and material advantages. In exemplary embodiments, the wedge surfaces may be provided with plural sloped portions such that a first portion is provided with a relatively lower slope while a second portion is provided with a relatively higher slope. Such contouring also takes into consideration the differences in pulling capacity of fully extended solenoids versus those approaching the end of their travel paths.

A further positive aspect of the presently disclosed wedge device is the provision of molded-in relief. Wedges, in accordance with present technology, may be formed of, for example, molded plastic or other relatively soft insulating material. The springs on which the switch contacts are to be mounted, however, are often formed by relatively hard stamped copper stock. Stamping of copper stock in such manner often results in sharp edges. Relieving (i.e., removing) selected portions of the wedge results in a spring that can not gouge the wedge because the relieved area is recessed from the wedge surface, in order to provide a space in which possible sharp edges may enter without hard to the wedge. This, in turn, decreases long term friction between the contact carrying spring and the wedge due to elimination of the possibility of the rough spring edges rubbing across the wedge. Relieving the wedge in such present manner, especially if done during the molding process, significantly reduces costs by eliminating any requirement for edge processing of the stamped copper stock forming the contact supporting spring.

One present exemplary embodiment relates to a wedge shaped actuator device configured to provide separation of spring supported electrical contacts in an electrical switch. Such present embodiment preferably may comprise an insulated wedge configured with plural contoured sides to maximize transfer of energy from a drive solenoid to the contact carrying springs.

In certain embodiments of the foregoing, portions of such wedge may be relieved to allow for uninhibited movement of such wedge over side surfaces of the contact carrying springs to avoid digging in from the side edges of such springs. Also in various embodiments, such plural contoured sides of such sedge shaped actuator device may comprise plural sloped portions such that a first portion is provided with a relatively lower slope while a second portion is provided with a relatively higher slope.

In other exemplary embodiments, a present wedge shaped actuator device may further include a plurality of such insulated wedges, configured to simultaneously and respectively separate multiple contacts. In other present exemplary embodiments, such insulated wedge may have a generally Y-shaped cross-section and/or such insulated wedge may comprise molded plastic.

Various present embodiments may include various combinations, for example, further including a drive solenoid associated with such insulated wedge, and directly integrated with a high current switching circuit within a utility meter.

Another exemplary embodiment of the present subject matter relates to a utility meter having a service disconnect switch integrated into the base thereof. Preferably, such meter may comprise a metrology board; a base integrally including high current circuit elements corresponding to a line side terminal assembly and a load side terminal assembly, each respectively configured for insertion into a utility meter socket; contacts associated with such line side terminal assembly; at least two pairs of spring elements respectively connected at one end thereof to the meter load terminal, with the opposite ends of such spring elements carrying contacts configured for cooperation with such line side terminal assembly contacts, so as to form contact pairs of a switch; a solenoid having a movable actuator; and an insulative wedge configured to be moved by such movable actuator for travel between portions of the spring element pairs to thereby separate corresponding contact pairs, for interrupting any current flow through such high current circuit elements. Such insulative wedge preferably may have plural contoured sides which comprise plural sloped portions such that a first portion is provided with a relatively lower slope while a second portion is provided with a relatively higher slope, for maximizing transfer of energy from such solenoid to such contact carrying springs.

In other present variations of the foregoing, such an exemplary utility meter may further include at least two pairs of such contact pairs; and at least a pair of such wedges respectively associated with such movable actuator and configured so as to respectively separate such contact pairs.

In other present exemplary variations, such insulative wedge may comprise molded plastic, with portions thereof relieved to allow for uninhibited movement of such wedge over side surfaces of the contact carrying springs to avoid digging in from the side edges of such springs. Still further, such insulative wedge in certain instances may include a Y-shaped cross-section.

Those of ordinary skill in the art will appreciate from the balance of the present disclosure that the present subject matter equally relates to and encompasses apparatus and corresponding methodology.

Another present exemplary embodiment relates to associated methodology. One exemplary method relates to providing a utility meter with a service disconnect switch integrated into the base thereof, including providing a meter having a metrology board; a base integrally including high current circuit elements corresponding to a line side terminal assembly and a load side terminal assembly, each respectively configured for insertion into a utility meter socket; contacts associated with such line side terminal assembly; at least two pairs of spring elements respectively connected at one end thereof to the meter load terminal, with the opposite ends of such spring elements carrying contacts configured for cooperation with such line side terminal assembly contacts, so as to form contact pairs of a switch; a solenoid having a movable actuator; and an insulative wedge configured to be moved by such movable actuator for travel between portions of the spring element pairs to thereby separate corresponding contact pairs, for interrupting any current flow through such high current circuit elements. Such method preferably further includes forming such insulative wedge with plural contoured sides which comprise plural sloped portions such that a first portion is provided with a relatively lower slope while a second portion is provided with a relatively higher slope, with such slopes selected so as to maximize transfer of energy from such solenoid to such contact carrying springs based on drive characteristics of such solenoid.

Other present methodologies may further include providing such meter with at least two pairs of such contact pairs; and providing at least a pair of such wedges respectively associated with such movable actuator and configured so as to respectively separate such contact pairs. In still further present alternative methodology, such insulative wedge may be formed of molded plastic, with portions thereof relieved to allow for uninhibited movement of such wedge over side surfaces of the contact carrying springs to avoid digging in from the side edges of such springs. Still as a further option, such insulative wedge may be formed with a Y-shaped cross-section.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A fall and enabling disclosure of the present subject matter, including the best mode thereof, directed to one of ordinary skill in the art, is set forth in the specification, which makes reference to the appended figures, in which:

FIG. 1 illustrates an oblique top and side view of an exemplary dual wedge, wedge/actuator in accordance with present technology;

FIG. 2 illustrates a central line cross-section of an exemplary present wedge/actuator, taken along section line 2-2 of FIG. 1;

FIG. 3 illustrates in cross-section an enlarged view of one exemplary wedge of the present exemplary dual wedge, wedge actuator, and more fully illustrates the dual slope aspects of such present exemplary wedge;

Figure 4:
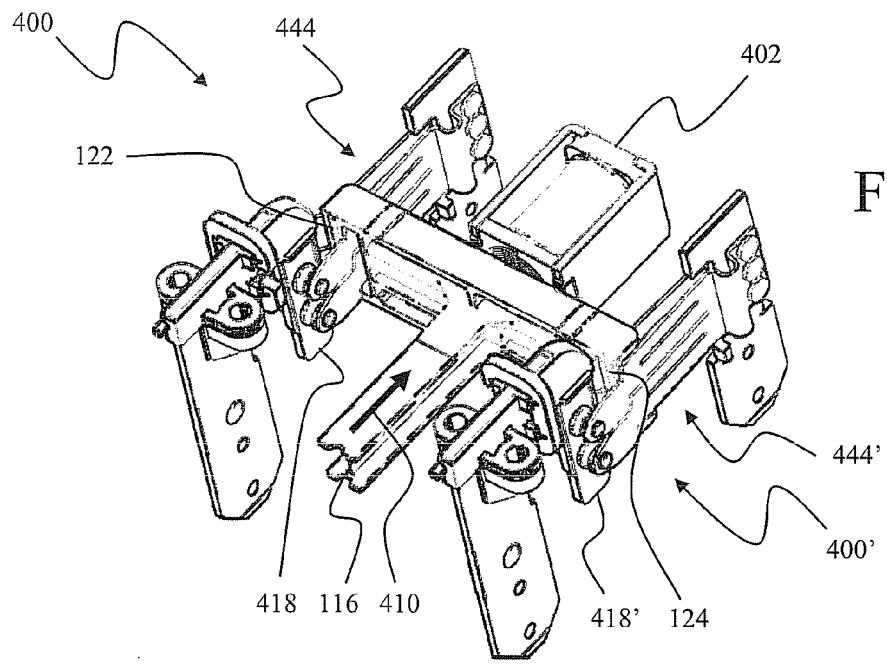
FIG. 4 illustrates and represents present exemplary methodology for using a wedge/actuator in accordance with present technology, in order to simultaneously separate multiple contacts in combination with a pair of high current metrology switches.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with the provision of wedge shaped switch operating apparatus that may be physical integrated with, among other switch types, high current switch devices integrated into an electricity meter. As have previously existed, there have been various meter types which may be used in the context of the present subject matter, which have been variously referred to as electricity meters, utility meters, revenue meters, watt-hour meters, and similar such designations. For purposes of the present disclosure, all such names are meant to designate a device used to measure consumption or generation of energy, more specifically, electrical energy, and may be used herein interchangeably and, in some instances, may simply be referred to as a meter.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will flow be made in detail to the presently preferred embodiments of the subject actuator/wedge improvements, which may for example be embedded in a meter switch. Referring to the drawings, FIG. 1 illustrates an oblique top and side view of an exemplary dual wedge, wedge/actuator generally 100 in accordance with present technology prior to integration within a meter assembly. As illustrated, wedge/actuator 100 corresponds to a top cross member 110 having end portions 112, 114 supporting generally Y-shaped cross-sectioned wedges 122, 124 by way of extension tabs 132, 134 and 136, 138, respectively. It will be seen that wedges 122, 124 are positioned such that an open space 142 is provided between end portion 114 and wedge 124. A similar open space (un-numbered) is provided between end portion 112 and wedge 122. Wedge/actuator 100 is also provided with an extension portion 116 that acts an a guide in cooperation with corresponding portions of a meter base as will be explained further below with reference to FIG. 5.

FIG. 2 illustrates a central line cross-section of the present exemplary wedge/actuator taken along section line 2-2 of FIG. 1. As may be seen more clearly in FIG. 2 and further in FIG. 3, wedges 122, 124 of exemplary wedge/actuator 100 are generally Y-shaped in cross-section to increase efficiency of the transfer of energy from a wedge/actuator driving device, for example a solenoid, to the spring elements supporting make and break contacts that permit or interrupt, respectively, the flow of current thorough the switch.

With further reference to FIG. 1, it will be noticed that wedges 122, 124 have been relieved at several locations. For example, wedge 122 has been relieved in areas 154, 156, 158 as well as in matching areas on the hidden opposite side of wedge 122, while wedge 124 has been relieved in areas 144, 146, 148 as well as in matching areas on the hidden opposite side of wedge 124. Use herein of the term "relieving" is meant to mean that material has been selectively removed from the wedge, or actually never provided if the wedges are molded, to allow uninhibited movement of a stamped spring element over the surface of the spring so that any rough side edges of such stamped spring elements are not permitted to dig into the surface of the wedges 122, 124.

With reference to FIG. 3, there is illustrated in cross-section an enlarged view of present exemplary wedge 124 of the subject present dual wedge, wedge actuator 100, more fully illustrating the dual slope aspects of such present exemplary wedge. As may be seen in FIG. 3, two differently sloped regions 162, 164 are provided on each side of wedge 124. A similar configuration is provided for wedge 122 and for any other of plural wedges as may be provided for any wedge/actuator 100 in accordance with present technology. Such differing slopes or contours maximize energy transfer from, for example, a magnetically latching solenoid switch operating drive element to the contact carrying springs of the switch. Such increase in energy transfer efficiency provides a reduction on the requirements of total energy that must be dumped from a solenoid driver circuit to the solenoid to accomplish a full stroke movement of the solenoid. Such fact reduces the requirements on capacitance, voltage, and series resistance, and provides a significant cost savings in materials.

Figure 5:
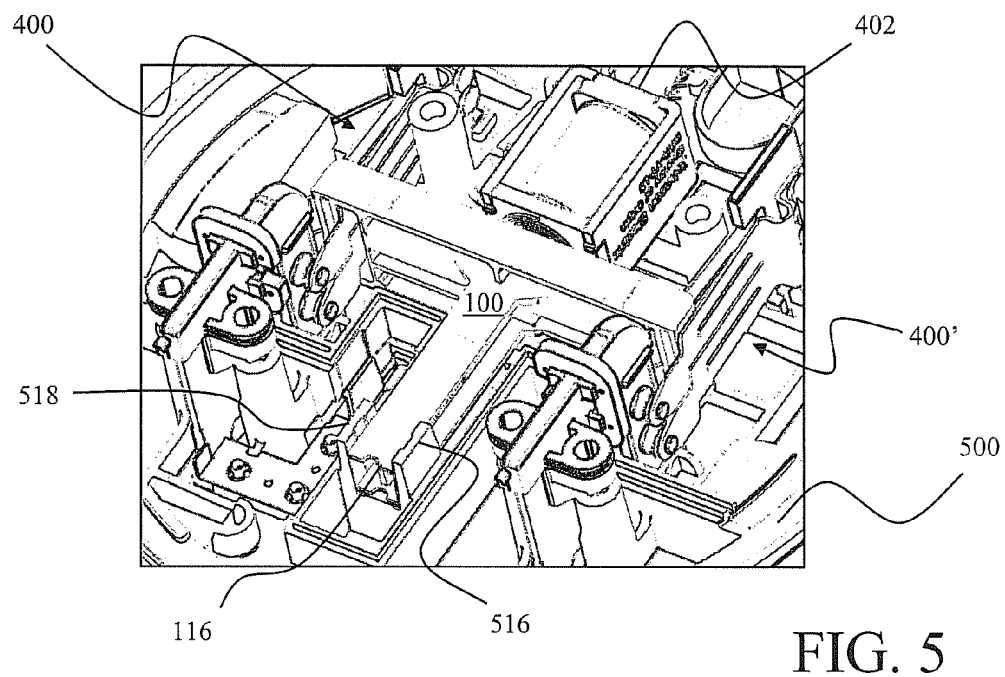
FIG. 5 illustrates an exemplary dual wedge, wedge/actuator in accordance with present technology in use with a pair of mechanical current circuit elements fully integrated within an exemplary and representative meter assembly.

With reference now to FIGS. 4 and 5, there is illustrated in FIG. 4 an assembly of a pair of mechanical current circuit elements 400, 400' as may be employed in an exemplary meter device to switch current flow on and off by automatic and/or remote control in, for example, a residential utility meter. An exemplary solenoid 402 is provided to operate wedge/actuator 100 in accordance with present technology. In such exemplary use of the subject wedge/actuator 100, the pair of mechanical current circuit elements 400, 400' may include a switch portion 444, 444' corresponding to a group of four contact carrying spring elements secured in pairs to each side of terminals 412, 412' of a metrology device, for example, a residential utility meter.

The contacts carried by the spring elements of the switch portion 444, 444' may be forced away from corresponding contacts carried by a conductive support element 418, 418' by operation of wedges 122, 124 respectively upon operation of solenoid 402 in conjunction with movement of wedge/actuator 100 in the direction of arrow 410 upon energization of solenoid 402.

With reference to FIG. 5, there is illustrated the incorporation of the exemplary wedge/actuator 100 in accordance with present technology as a portion of the switch operating elements of a pair of mechanical current circuit elements 400, 400' integrated into an exemplary representative utility meter base generally 500. As seen in FIG. 5, wedge/actuator 100 includes a guide portion 116 configured to cooperate with elements 516, 518 incorporated into meter base 500.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A wedge shaped actuator device configured to provide separation of spring supported electrical contacts in an electrical switch, comprising an insulated wedge configured with plural contoured contact separating surfaces corresponding to a relatively lower and a relatively higher slope to maximize transfer of energy from a drive solenoid to the contact carrying springs, whereby each of said plural contoured contact separating surfaces applies contact separating force corresponding to differences in pulling capacity as said drive solenoid traverses its travel path.

2. A wedge shaped actuator device as in claim 1, wherein portions of said wedge are relieved to allow for uninhibited movement of said wedge over side surfaces of the contact carrying springs to avoid digging in from the side edges of such springs.

3. A wedge shaped actuator device as in claim 1, wherein said plural contoured sides comprise plural sloped portions such that a first portion is provided with a relatively lower slope while a second portion is provided with a relatively higher slope.

4. A wedge shaped actuator device as in claim 1, further including a plurality of said insulated wedges, configured to simultaneously and respectively separate multiple contacts.

5. A wedge shaped actuator device as in claim 1, wherein said insulated wedge has a generally Y-shaped cross-section.

6. A wedge shaped actuator device as in claim 1, wherein said insulated wedge comprises molded plastic.

7. A wedge shaped actuator device as in claim 1, further including a drive solenoid associated with said insulated wedge, and directly integrated with a high current switching circuit within a utility meter.

8. A utility meter having a service disconnect switch integrated into the base thereof, said meter comprising:

a metrology board;

a base integrally including high current circuit elements corresponding to a line side terminal assembly and a load side terminal assembly, each respectively configured for insertion into a utility meter socket;

contacts associated with said line side terminal assembly;

at least two pairs of spring elements respectively connected at one end thereof to the meter load terminal, with the opposite ends of said spring elements carrying contacts configured for cooperation with said line side terminal assembly contacts, so as to form contact pairs of a switch;

a solenoid having a movable actuator; and an insulative wedge configured to be moved by said movable actuator for travel between portions of the spring element pairs to thereby separate corresponding contact pairs, for interrupting any current flow through said high current circuit elements, said insulative wedge having plural contact separating surfaces which comprise plural sloped portions such that a first portion is provided with a relatively lower slope while a second portion is provided with a relatively higher slope, for maximizing transfer of energy from said solenoid to said contact carrying springs, whereby each of said plural contoured contact separating surfaces applies contact separating force corresponding to differences in pulling capacity as said movable actuator traverses its travel path.

9. A utility meter as in claim 8, further including:

at least two pairs of said contact pairs; and at least a pair of said wedges respectively associated with said movable actuator and configured so as to respectively separate said contact pairs.

10. A utility meter as in claim 8, wherein said insulative wedge comprises molded plastic, with portions thereof relieved to allow for uninhibited movement of said wedge over side surfaces of the contact carrying springs to avoid digging in from the side edges of such springs.

11. A utility meter as in claim 8, wherein said insulative wedge includes a Y-shaped cross-section.

12. A method of providing a utility meter with a service disconnect switch integrated into the base thereof, such method comprising:
    providing a meter having:
        a metrology board;
        a base integrally including high current circuit elements corresponding to a line side terminal assembly and a load side terminal assembly, each respectively configured for insertion into a utility meter socket;
        contacts associated with such line side terminal assembly;
        at least two pairs of spring elements respectively connected at one end thereof to the meter load terminal, with the opposite ends of such spring elements carrying contacts configured for cooperation with such line side terminal assembly contacts, so as to form contact pairs of a switch;
        a solenoid having a movable actuator; and
    an insulative wedge configured to be moved by such movable actuator for travel between portions of the spring element pairs to thereby separate corresponding contact pairs, for interrupting any current flow through such high current circuit elements; and
    forming such insulative wedge with plural contact separating surfaces which comprise plural sloped portions such that a first portion is provided with a relatively lower slope while a second portion is provided with a relatively higher slope, with such slopes selected so as to maximize transfer of energy from such solenoid to such contact carrying springs based on drive characteristics of such solenoid,
        whereby each of said plural contoured contact separating surfaces applies contact separating force corresponding to differences in pulling capacity as said movable actuator traverses its travel path.

13. A method as in claim 12, further including:
    providing such meter with at least two pairs of such contact pairs; and
    providing at least a pair of such wedges respectively associated with such movable actuator and configured so as to respectively separate said contact pairs.

14. A method as in claim 12, wherein such insulative wedge is formed of molded plastic, with portions thereof relieved to allow for uninhibited movement of such wedge over side surfaces of the contact carrying springs to avoid digging in from the side edges of such springs.

15. A method as in claim 12, wherein such insulative wedge is formed with a Y-shaped cross-section.

* * * * *